US006812492B1

(12) United States Patent
Choi

(10) Patent No.: US 6,812,492 B1
(45) Date of Patent: Nov. 2, 2004

(54) METHOD OF FABRICATING A THIN FILM TRANSISTOR

(75) Inventor: Dong-Wook Choi, Incheon (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/205,970

(22) Filed: Dec. 4, 1998

(30) Foreign Application Priority Data

Dec. 8, 1997 (KR) ............................................ 97-66617

(51) Int. Cl.[7] ......................................... H01L 21/108
(52) U.S. Cl. ............................ 257/69; 257/72; 438/163
(58) Field of Search ..................... 257/69, 72; 438/163, 438/154, 155, 157

(56) References Cited

U.S. PATENT DOCUMENTS

| 4,403,026 | A | * | 9/1983 | Shimizu et al. | ............... | 430/65 |
| 5,292,675 | A | * | 3/1994 | Codama | .................... | 438/163 |
| 5,648,277 | A | * | 7/1997 | Zhang et al. | ............... | 438/151 |
| 5,712,495 | A | * | 1/1998 | Suzawa | ........................ | 257/51 |
| 6,127,211 | A | * | 10/2000 | Hirao et al. | ................ | 438/158 |

FOREIGN PATENT DOCUMENTS

| JP | 7-335891 | 12/1995 |
| JP | 7-335903 | 12/1995 |
| JP | 8-64549 | * 3/1996 |
| JP | 10-12890 | * 1/1998 |

OTHER PUBLICATIONS

Hayashi et al., "Fabrication of Low–Temperature Bottom–Gate Poly–Si TFTs on Large–Area Substrate by Linear–Beam Excimer Laser Crystallization and Ion Doping Method", IEDM, vol. 95, pp. 829–832, 1995.*

* cited by examiner

*Primary Examiner*—Amir Zarabian
*Assistant Examiner*—Jeff Vockrodt
(74) *Attorney, Agent, or Firm*—McKenna Long & Aldridge

(57) ABSTRACT

The present invention relates to a method of fabricating a lightly-doped drain ("LDD") thin film transistor of a coplanar type wherein the transistor has an LDD region of uniform resistance formed by locating a peak point of dopant in an active layer covered with an insulating layer wherein the dopant is very lightly distributed. The present invention further includes the steps of forming an active layer on an insulated substrate, forming an insulating layer covering the active layer, forming a gate electrode on the insulating layer over the active layer, doping lightly the active layer as a target with impurities, forming a gate insulating layer by patterning the insulating layer to be extended out of the gate electrode, and forming a source region and a drain region in portions of the active layer which are exposed by the step of forming the gate insulating layer.

18 Claims, 6 Drawing Sheets

METHOD OF FABRICATING A THIN FILM TRANSISTOR

BACKGROUND OF THE INVENTION

1. Field of Invention

The present invention relates to a method of fabricating a thin film transistor, more particularly, to a method of fabricating a lightly-doped drain ("LDD") thin film transistor of a coplanar type wherein the transistor has an LDD region of uniform resistance formed by locating a peak point of dopant in an active layer covered with an insulating layer wherein the dopant is very lightly distributed.

2. Description of Related Art

Compared to an amorphous silicon Thin Film Transistor ("TFT"), a polycrystalline silicon TFT has a higher mobility of electrons or holes which enables the latter to embody a complementary thin film transistor, namely a complementary metal oxide silicon thin film transistor ("CMOS TFT"). The development of laser crystallization enables the fabrication of polycrystalline silicon transistors on a large scale glass substrate at a normal temperature of fabricating amorphous silicon Thin Film Transistors ("TFT").

A liquid crystal display ("LCD") using polycrystalline silicon TFTs includes both a driver and a pixel array on a glass substrate. TFTs in the driver carry out fast switching operations due to the characteristic advantages of polycrystalline silicon, thus minimizing problems. However, TFTs for switching pixels in the pixel array decrease the image characteristics since the voltage width of a pixel electrode is broadened due to a large drain current during off-state. Conventionally, a lightly doped drain or an offset structure is applied to a TFT in order to properly reduce the off current in a pixel array.

FIGS. 1A-1D show schematic cross-sectional views of one related art method for fabricating an LDD TFT.

Referring to FIG. 1A, a buffer layer 10 is formed on an insulated substrate 100. An active layer 11 is defined by a photolithographic process, which is a patterning process common to all TFT fabrication processes, involving the patterning of a polycrystalline silicon layer formed on the buffer layer 10. The polycrystalline silicon layer may be formed by depositing amorphous silicon on the buffer layer 10 and by crystallizing the amorphous silicon with dehydrogenation and a laser annealing process. Subsequently, an insulating layer 12L and a conductive layer 13L are respectively formed on disclosed surfaces of the buffer layer 10 and the active layer 11.

As shown in FIG. 1B, a gate electrode 13 is formed by etching the conductive layer 13L with photolithography. A gate insulating layer 12 is formed by etching the insulating layer 12L using the gate electrode 13 as an etch mask.

According to FIG. 1C, a photoresist pattern PR blocks both the gate electrode 13 and the active layer 11 and an LDD region is formed in the active layer 11. A source region 11S and a drain region 11D are formed in the active layer 11 by doping the whole surface of the substrate 100 heavily with n-type impurities.

Referring to FIG. 1D, after the photoresist pattern PR has been removed, an LDD region 11L is formed in the active layer 11 by lightly doping the whole surface of the substrate with the n-type impurities. Thereafter, the n-type impurities are activated and the following processes are carried out.

In the above-described related art, the insulating layer covering the active layer is etched as shown in FIG. 1B in order to form a gate insulating layer. Generally, the step of etching the insulating layer is carried out by a dry etch. The dry etch removes the etched layer after having reacted with plasma to be volatile in a vacuum chamber.

However, when the insulating layer is etched according to the prior art method, a surface of the active layer is exposed during the etching process. Consequently, the exposed portion of the active layer is damaged by the plasma, thereby reducing the desirable characteristics of a TFT such as decreased on-current and an increased off-current effects FIGS. 2A-2D show schematic cross-sectional views of another method of fabricating an LDD TFT. These figures show how to form an LDD region by utilizing a Gaussian distribution of impurity density.

As illustrated in FIG. 2A, an active layer 21 is formed on a buffer layer 20 which has been formed on an insulated substrate 200. The active layer maybe formed by depositing an amorphous silicon layer on the buffer layer 20, by forming a polycrystalline silicon layer by crystallizing the amorphous silicon layer and subsequently, by patterning the polycrystalline silicon layer with photolithography.

A gate insulating layer 22L is formed on the buffer layer 20 and the active layer 21. Thereafter, a conductive layer 23L is deposited on the gate insulating layer 22L. A gate electrode 23 is formed by etching the conductive layer 23L with photolithography.

Referring to FIG. 2B, the substrate 200 is heavily doped with impurities so that the insulating layer 22L includes the maximum value of impurity density and the active layer 21 has a certain density distribution corresponding to a tail region in accordance with a Gaussian distribution. Accordingly, the active layer 21 becomes lightly doped with n-type impurities, which is achieved by controlling the implantation energy of impurities which locates the maximum value of density.

Referring to FIG. 2C, a gate insulating layer 22 is formed by patterning the insulating layer 22L with photolithography. In this case, the gate insulating layer 22 is defined to be extended out of the gate electrode 23 in order to cover an LDD region in the active layer 21.

Referring to FIG. 2D, a source region 21S and a drain region 21D are formed on portions of the active layer 21 which are heavily doped with n-type impurities in use of the gate insulating layer 22 as a dopant-blocking mask. In this case, a part blocked from the heavy doping in the active layer 21 where impurities are lightly distributed becomes an LDD region 21L. Then, following processes including activation are carried out.

In the above description, when a heavy doping step is being processed, the LDD region is formed by locating the maximum value of impurity density at the insulating layer 22L and by placing a certain density distribution corresponding to a tail region at the active layer 21 in accordance with a Gaussian distribution. However, as the slope of the density distribution near the tail region becomes steep, the density of the impurities distributed in the active layer is influenced by the variation of the thickness of the insulating layer. Generally, the insulating layer is deposited within an error of approximately 100□, thereby causing a corresponding error in the LDD region between tens of K□ and several M□. Accordingly, the effect of the TFT is reduced since the resistance is not maintained uniformly in the LDD region.

Moreover, a laser may break down the insulating layer as the substrate is irradiated with a laser of high energy in order to activate an LDD region in the active layer having been lightly doped with impurities.

SUMMARY OF THE INVENTION

Accordingly, the present invention is directed to a method of fabricating a thin film transistor that substantially obviates one or more of the problems due to limitations and disadvantages of the prior art.

The object of the present invention is to provide a method of fabricating a thin film transistor which has an LDD region of uniform resistance formed by locating a peak point of dopant in an active layer covered with an insulating layer wherein the dopant is very lightly distributed.

Another object of the present invention is to provide a method of fabricating a thin film transistor having an LDD region of uniform resistance attained by decreasing the density variation of impurities which are distributed very lightly.

Additional features and advantages of the invention will become apparent from the following detailed description of the present invention. The objectives and other advantages of the invention will be obtained by the structures described in the written description and claims hereof as well as the appended drawings.

In order to achieve these and other advantages and in accordance with the purpose of the present invention, as embodied and broadly described, the present invention includes the steps of forming an active layer on an insulated substrate, forming an insulating layer covering the active layer, forming a gate electrode on the insulating layer over the active layer, lightly doping the active layer as a target with impurities, forming a gate insulating layer by patterning the insulating layer to be extended out of the gate electrode, and forming a source region and a drain region in portions of the active layer exposed by the step of forming the gate insulating layer, wherein the impurities have a density of under 0.1% in a source gas for doping and are composed of $PH_3$ values of under 0.1% and $H_2$ over 99.9%.

The foregoing general description and the following detailed descriptions are exemplary and explanatory in nature and are intended to provide further descriptions and explanation of the invention as claimed.

BRIEF DESCRIPTION OF THE ATTACHED DRAWINGS

A detailed description of embodiments of the invention will be made with reference to the accompanying drawings, wherein the like numerals designate corresponding parts in the several figures.

DETAILED DESCRIPTION OF PREFERRED EMBODIMENTS

Reference will now be made in detail to the preferred embodiment of the present invention as illustrated in the accompanying drawings.

Figure 1A:
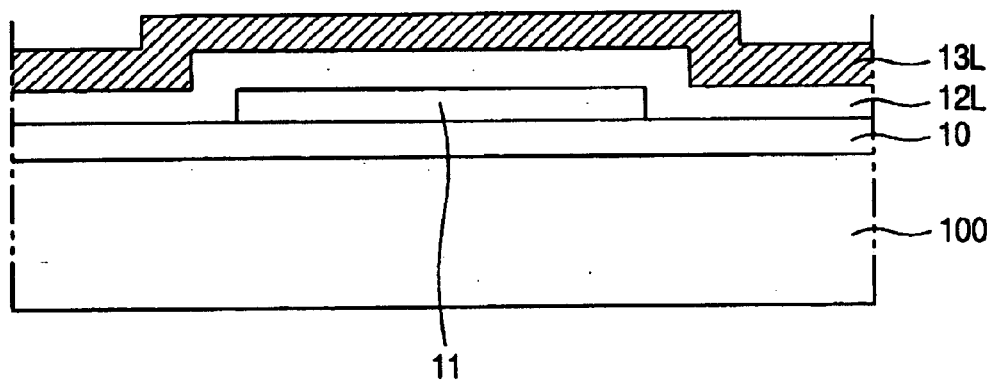
FIGS. 1A-1D show schematic cross-sectional views of a first related art method of fabricating a TFT.
Figure 1B:
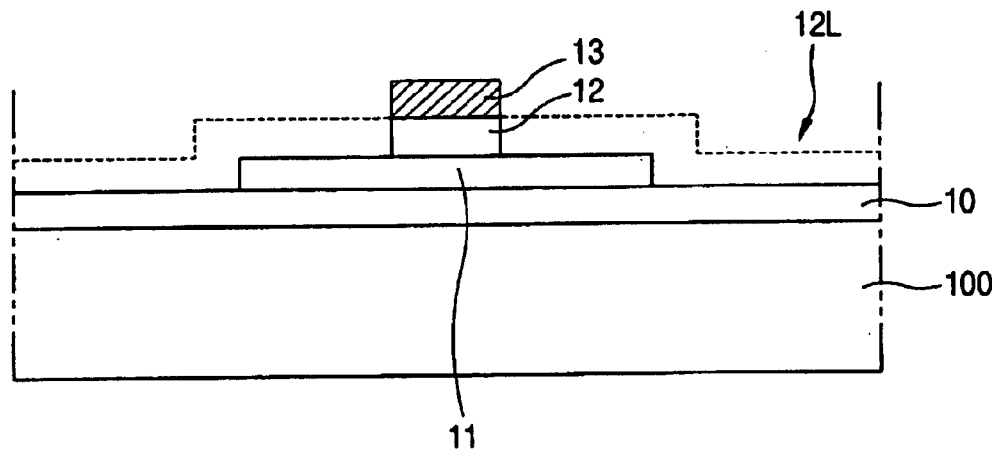
Figure 1C:
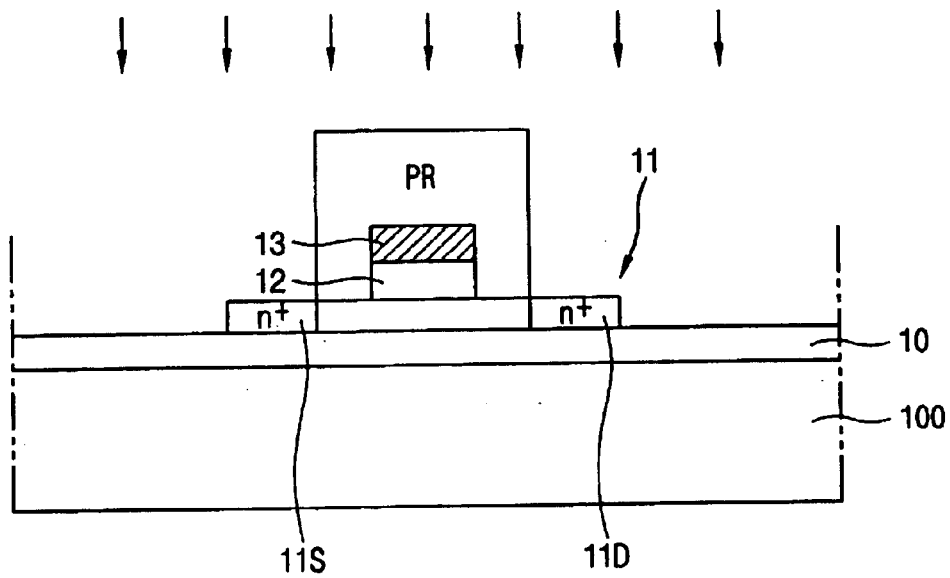
Figure 1D:
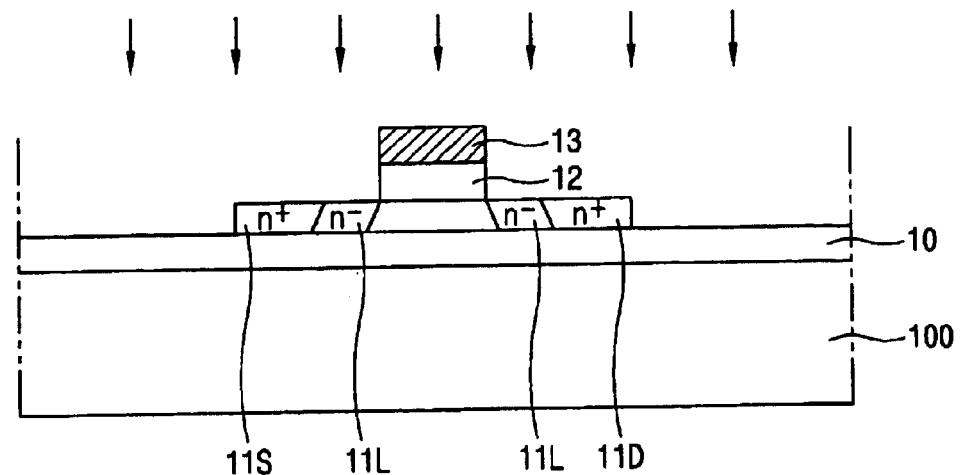
Figure 2A:
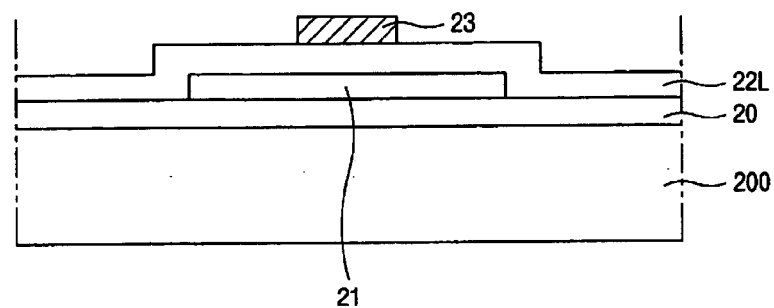
FIGS. 2A-2D show schematic cross-sectional views of a second related art method of fabricating a TFT.
Figure 2B:
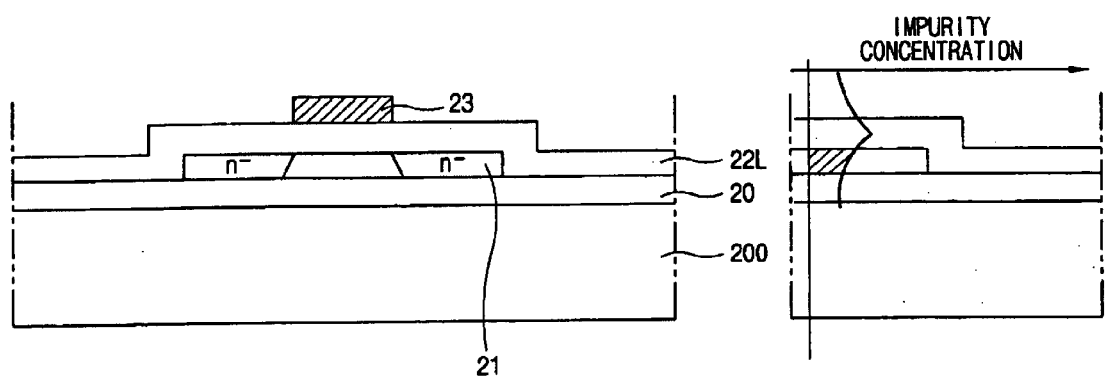
Figure 2C:
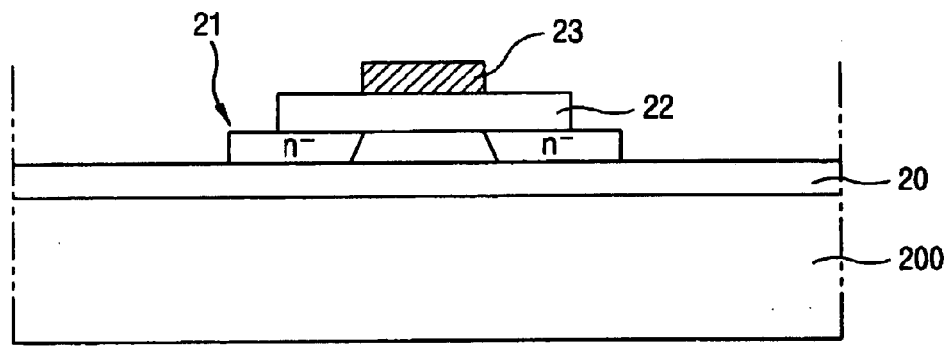
Figure 2D:
Figure 2D:
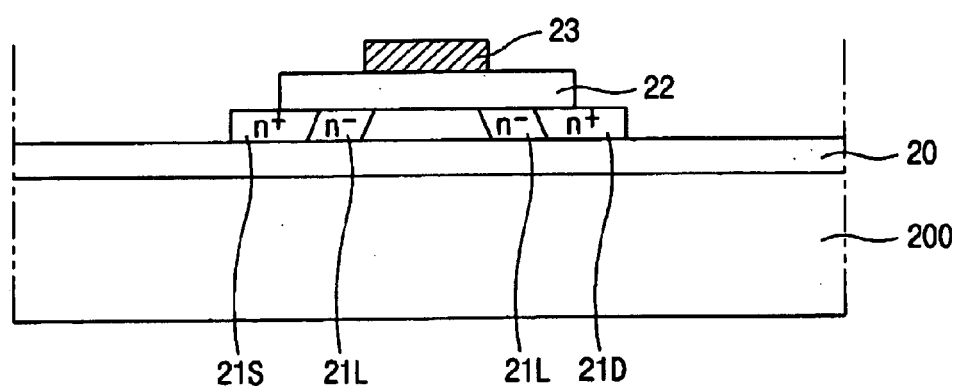
Figure 3A:
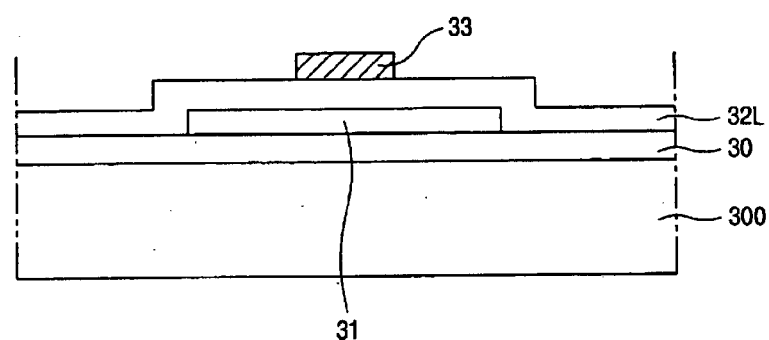
FIGS. 3A-3D show cross-sectional views of fabricating a TFT according to the present invention.

FIGS. 3A-3D show schematic cross-sectional views of fabricating an LDD TFT according to the present invention. As indicated in FIG. 3A, an active layer 31 is formed on a buffer layer 30 which has been formed on an insulated substrate 300. The active layer 31 may be formed by depositing an amorphous silicon layer on the buffer layer 30, by forming a polycrystalline silicon layer by crystallizing the amorphous silicon layer and subsequently, by patterning the polycrystalline silicon layer with photolithography.

An insulating layer 32L is formed on the buffer layer 30 and the active layer 31. Then, a conductive layer 33L is deposited on the insulating layer 32L. A gate electrode 33 is formed by etching the conductive layer 33L with photolithography.

Figure 3B:
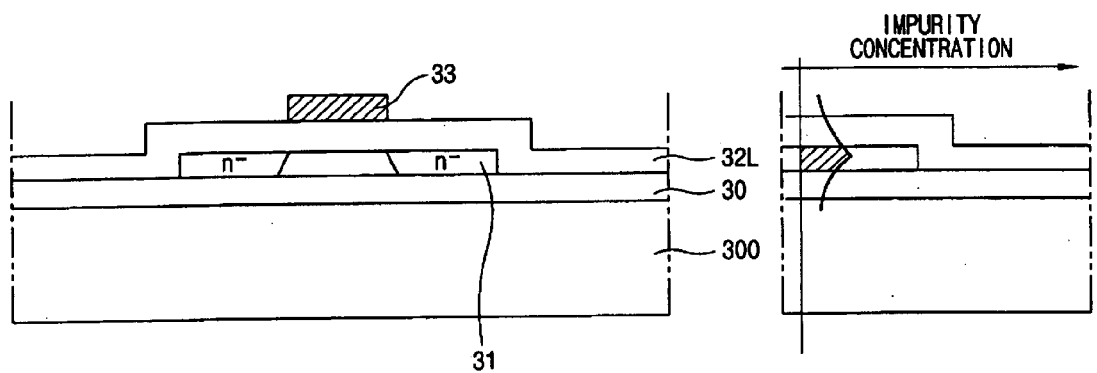

According to FIG. 3B, the substrate 300 is doped with impurities of an extremely low density. For example, the density of the impurities is preferably under 0.1% in an source gas for doping. Therefore, the active layer 31 is lightly doped by properly controlling the implantation energy so as to achieve a maximum value of impurity density at the active layer 31. As the density of the impurities is extremely low and the active layer 31 is the target of the dopants, a density slope of the impurities in the active layer is likely to be lower. Thus, according to the present invention, the resistance of the active layer wherein the impurities are lightly distributed is more uniform than the resistance provided by the prior art.

In the present invention, the n-type impurities may be preferably composed of $PH_3$ under 0.1% and $H_2$ over 99.9% to carry out the doping process and the location of the maximum density value of the impurities is controlled by the acceleration energy of the dopants in the process of forming an lightly doped (drain) region in the active layer by doping the active layer with impurities. Other types of impurities known to one of ordinary skill in the art may also be used.

Figure 3C:
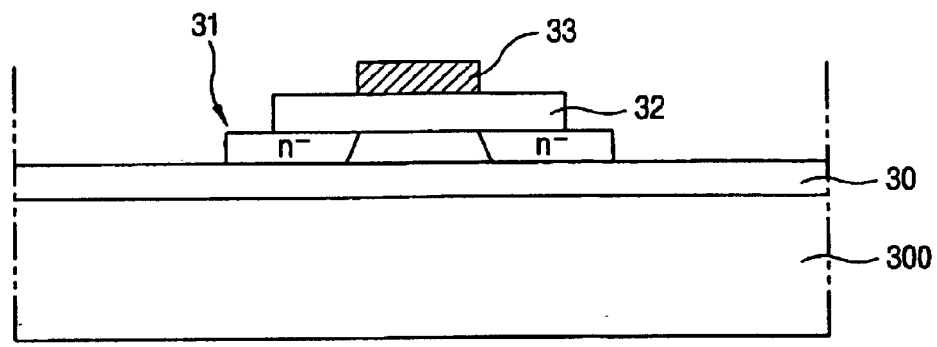

Referring to FIG. 3C, a gate insulating layer 32 is formed by patterning the insulating layer 32L with photolithography. Here, the gate insulating layer 32 is defined to be extended out of the gate electrode 33 in order to cover an LDD region in the active layer 21.

Figure 3D:
Figure 3D:
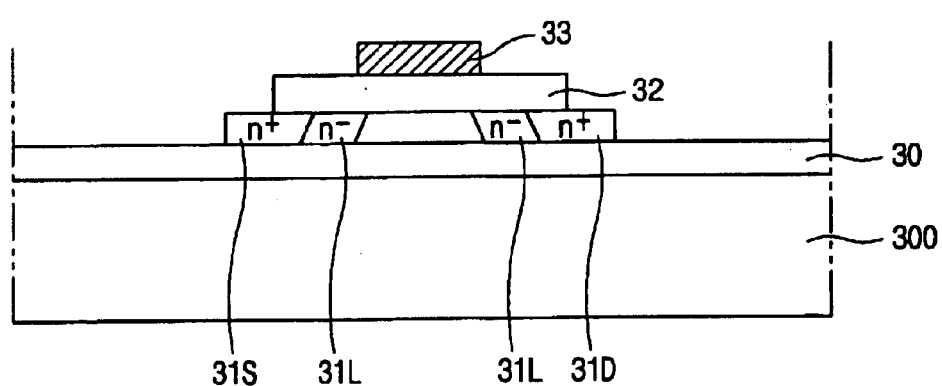

Moreover, as shown in FIG. 3D, a source region 31S and a drain region 31 D are formed at portions of the active layer 31 which are heavily doped with n-type impurities by using the gate insulating layer 32 as a dopant-blocking mask. For example, the density of the n-type impurities may be under 0.1% in a source gas for doping. The n-type impurities may be composed of $PH_3$ under 0.1% and $H_2$ over 99.9%. Consequently, portions blocked from the heavy doping in the active layer 31, where lightly distributed impurities are found, become the LLD region 31L. The, the following processes including the activation are carried out.

In the present invention, compared to prior art methods, the amorphous tendency of the active layer due to ion implantation is brought under control since the impurity density of the LDD region is extremely low. Accordingly, without a laser annealing using high energy density, the LDD region may be activated by a conventional heat treatment.

Furthermore, the resistance of the active layer according to the present invention, where the impurities are lightly distributed, becomes more uniform than the resistance values of the prior art since the active layer covered with the insulating layer is doped with impurities of extremely low density. Thus, the process margin is markedly improved. Additionally, during the process of etching an insulating layer, damage on an active layer by plasma is prevented as well.

Moreover, as the LDD region is doped with impurities of extremely low density, without a laser annealing of high energy, the LDD region may be activated by a conventional heat treatment of the following processes.

It will be apparent to those skilled in the art that various modifications and variations can be made in methods of fabricating a thin film transistor of the present invention without departing from the spirit or scope of the invention as set forth in the claims. Thus, it should be understood that many modifications, variations, changes in the steps or sequence of steps of the methods described herein will readily occur to those skilled in the art without departing from the spirit and scope of this invention, its appended claims and equivalents.

What is claimed is:

1. A method of fabricating a thin film transistor having a lightly-doped drain region, comprising the steps of:

forming an active layer on a substrate;

forming an insulating layer covering at least a portion of the active layer;

forming a gate electrode on the insulating layer over the active layer;

doping the active layer with first impurities;

forming a gate insulating layer by patterning the insulating layer, wherein the gate insulating later covers at least a portion of the active layer doped with the impurities; and doping the active layer with second impurities using the gate insulating layer as a mask, wherein a portion of the active layer not covered by the gate insulating layer is directly exposed to the second impurities;

wherein the first and second impurities include about 0.1% $PH_3$.

2. The method according to claim 1, further including forming a source region and a drain region at separated ends of the active layer not covered by the gate insulating layer.

3. The method according to claim 1, wherein the first and second impurities are the same.

4. The method according to claim 1, wherein the first and second impurities include about 0.1% $PH_3$ and about 99.9% $H_2$.

5. The method according to claim 1, wherein the first impurities have a Gaussian distribution with a peak density region representing the presence of the highest impurity density, wherein the active layer is doped with the first impurities at a predetermined energy value to place the peak density region of the first impurities to be arranged in the active layer.

6. The method according to claim 1, wherein the first impurities have a Gaussian distribution with a peak density region representing the presence of the highest impurity density and a tail density region representing the presence of low impurity density, wherein the active layer is doped with the first impurities at a predetermined energy value to place the tail density region of the first impurities to be arranged in the active layer.

7. The method according to claim 1, wherein the active layer is lightly doped with the first impurities.

8. The method according to claim 1, wherein the active layer lightly doped with the first impurities had substantially uniform resistance.

9. The method according to claim 1, wherein the active layer lightly doped with the first impurities has substantially uniform resistance.

10. A method of fabricating a thin film transition having a lightly-doped drain region, comprising the steps of:

forming an active layer on a substrate;

forming an insulating layer covering at least a portion of the active layer;

forming a gate electrode on the insulating layer over the active layer;

doping the active layer with first impurities;

forming a gate insulating layer by patterning the insulating layer, wherein the gate insulating layer covers at least a portion of the active layer doped with the impurities; and doping the active layer with second impurities using the gate insulating layer as a mask, wherein a portion of the active layer not covered by the gate insulating layer is directly exposed to the second impurities;

wherein the first and second impurities have a density of under 0.1% in a source gas for doping.

11. A method of fabricating a thin film transistor having a lightly-doped drain region, comprising the steps of:

forming an active layer on a substrate;

forming an insulating layer covering at least a portion of the active layer;

forming a gate electrode on the insulating layer over the active layer;

doping the active layer with first impurities;

forming a gate insulating layer by patterning the insulating layer, wherein the gate insulating layer covers at least a portion of the active layer doped with the impurities;

doping the active layer with second impurities using the gate insulating layer as a mask, wherein a portion of the active layer not covered by the gate insulating layer is directly exposed to the second impurities; and forming a source region and a drain region at separated ends of the active layer not covered by the gate insulating layer;

wherein the first and second impurities include about 0.1% $PH_3$.

12. The method according to claim 11, wherein the first and second impurities are the same.

13. The method according to claim 11, wherein the first and second impurities include about 0.1% $PH_3$ and about 99.9% $H_2$.

14. The method according to claim 11, wherein the first impurities have a Gaussian distribution with a peak density region representing the presence of the highest impurity density, wherein the active layer is doped with the first impurities at a predetermined energy value to place the peak density region of the first impurities to be arranged in the active layer.

15. The method according to claim 11, wherein the first impurities have a Gaussian distribution with a peak density region representing the presence of the highest impurity density and a tail density region representing the presence of low impurity density, wherein the active layer is doped with the first impurities at a predetermined energy value to place the tail density region of the first impurities to be arranged in the active layer.

16. The method according to claim 11, wherein the active layer is lightly doped with the first impurities.

17. A thin film transistor made with the process of claim 11.

18. A method of fabricating a thin film transistor having a lightly-doped drain region, comprising the steps of:

forming an active layer on a substrate;

forming an insulating layer covering at least a portion of the active layer;

forming a gate electrode on the insulating layer over the active layer;

doping the active layer with first impurities;

forming a gate insulating layer by patterning the insulating layer, wherein the gate insulating layer covers at least a portion of the active layer doped with the impurities;

doping the active layer with second impurities using the gate insulating layer as a mask, wherein a portion of the active layer not covered by the gate insulating layer is directly exposed to the second impurities; and forming a source region and a drain region at separated ends of the active layer not covered by the gate insulating layer;

wherein the first and second impurities have a density of under 0.1% in a source gas for doping.

* * * * *